W. P. HEATH
Dec. 17, 1929 METHOD AND MEANS FOR TUNING RADIORECEIVERS Re. 17,531
Original Filed Nov. 13, 1924
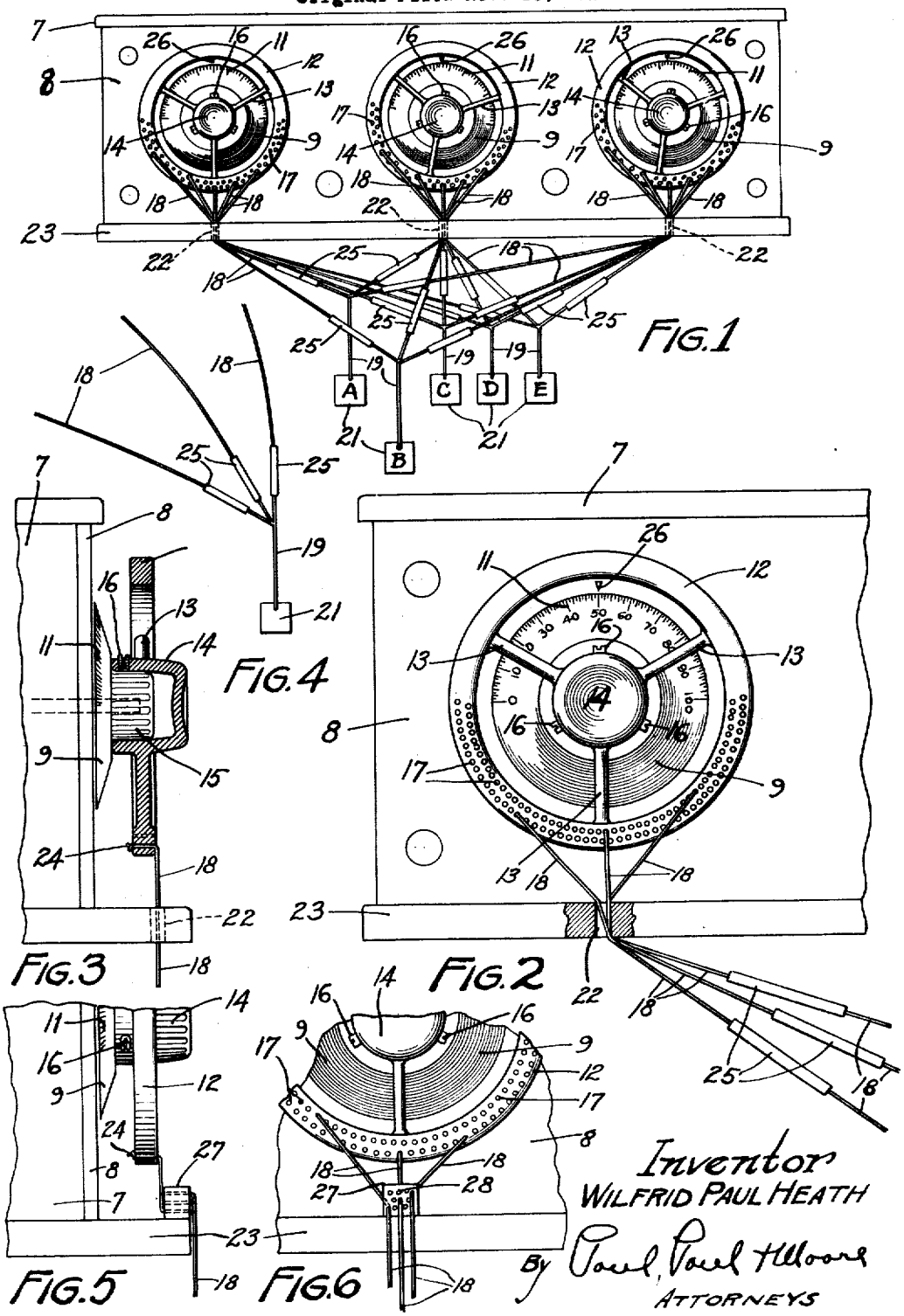
Inventor
WILFRID PAUL HEATH
By Paul, Paul & Moore
ATTORNEYS Reissued Dec. 17, 1929 Re. 17,531

UNITED STATES PATENT OFFICE

WILFRID PAUL HEATH, OF SEATTLE, WASHINGTON, ASSIGNOR TO ZENITH RADIO CORPORATION, OF CHICAGO, ILLINOIS, A CORPORATION OF ILLINOIS

METHOD AND MEANS FOR TUNING RADIORECEIVERS

Original No. 1,638,734, dated August 9, 1927, Serial No. 749,771, filed November 13, 1924. Application for reissue filed February 23, 1929. Serial No. 342,234.

This invention relates to an improved method and means for actuating the tuning elements of a radio receiving set for tuning it to the wave length of a given broadcasting station, and more particularly relates to such devices operable with sets having a plurality of dials.

Certain types of radio receivers employ a plurality of tuning dials, all of which are manipulated in tuning in a broadcasting station or in tuning from one station to another. The method employed at present to tune such a receiver usually requires considerable patience, as the various tuning elements employed usually bear a certain relation to one another and must therefore be adjusted to a predetermined position to tune the receiver to the wave length of the desired broadcasting station. To tune such a receiver requires considerable manipulation of the tuning dials, as the operator is only capable of manipulating two of the dials at one time. Thus to tune the various tuning elements of the receiver into resonance with one another and to the wave length of the desired station may be a tedious operation and may also require considerable time, and be therefore objectionable, as the ideal method is to tune from one station to another immediately.

An object of this invention therefore is to provide an improved means operable with an ordinary receiving set for tuning all the tuning elements simultaneously to the wave length of the desired station.

A further and more specific object of the invention is to provide such a device demountably secured to the tuning dials, and therefore used as an attachment to an ordinary receiver whereby the tuning dials may be selectively turned to a predetermined setting for a given station by a single operation.

Other objects of the invention will appear from the following description and the accompanying drawings and will be pointed out in the annexed claims.

In the drawings, there has been disclosed a structure designed to carry out the various objects of the invention, but it is to be understood that the invention is not confined to the exact structure shown, as various changes may be made within the scope of the claims which follow.

In the accompanying drawings forming a part of this specification,

Figure 1 is a view in front elevation of a popular type of receiver, showing my invention applied thereto;

Figure 2 is an enlarged detail view of a portion of the receiver, showing the improved tuning means demountably secured to one of the dials thereof, and also showing the operating means therefor;

Figure 3 is a sectional view to show the preferred manner of mounting the device on the receiver dial;

Figure 4 is a detail view of the flexible means adapted to be selectively secured to the dial-actuating devices for simultaneously actuating the dials;

Figure 5 is a view showing a slightly modified construction; and

Figure 6 is a front view of Figure 5.

In the selected embodiment of the invention here shown, there is illustrated an ordinary type of radio receiving set comprising a cabinet 7 having the usual panel 8 on which the usual tuning dials 9 are mounted. The usual graduations or markings 11 are shown on the dials so that the dials may be turned to a predetermined position in tuning in a broadcasting station. In receivers of the type here shown, the various tuning elements employed in the receiver usually bear a certain relation with respect to one another, and it is therefore necessary that each dial be adjusted to a certain position with relation to the other dials to tune the receiver to the wave length of a given broadcasting station. This requires considerable manipulation of the dials by the operator before a station can be tuned in, as it is impossible for the operator to turn more than two dials at one time. Tuning of such a receiver therefore often requires considerable time and patience on the part of the operator.

The feature of this invention is to provide a simple and inexpensive means which may be applied to any ordinary receiver whereby all of the tuning elements may be simultaneously and selectively adjusted to the wave length of a given broadcasting station. The means provided for this purpose preferably consists of a spider-like member comprising an annular ring 12 having a series of integral spokes 13 connecting it to a hub 14 adapted to be fitted over the usual knob or finger-grip 15 of the dial 9, as shown in Figure 3. The hub is demountably secured to the knob 15 by such means as the set screws 16. The hub 14 is also shaped to provide a finger-grip whereby the operator may adjust the dial 9 in the usual manner in locating or logging the various stations. As shown in Figure 2, the annular ring 12 of the spider-like member is preferably of such size that the inside diameter thereof will be relatively larger than the outside diameter of the tuning dial 9 so that the operator may see the usual markings on the dial when tuning in a station.

A series of apertures 17 are provided in a portion of the annular ring 12, as particularly shown in Figure 2, and these apertures are preferably spaced to correspond to the markings on the dial and are so arranged that they will be located in that portion of the ring opposite the markings 11 on the dial. The means provided for actuating the spider-like members, and therefore the dials 9, preferably consists in a flexible means connecting together the three dials. As shown in Figure 4, this flexible means preferably consists of a series of cords 18 connected together at one end and secured to a main cord 19 having suitable tabs 21 secured to the lower end thereof upon which the usual call letters of the station may be stamped or marked, as indicated by the letters A, B, C, D and E. The other ends of the cords 18 preferably pass upwardly through a series of apertures 22 provided in the baseboard 23 of the receiver and are detachably secured to the annular ring 12 by means of the apertures 17, preferably by being knotted at 24 therein as shown in Figure 3. Thus when the cords have been secured to the rings 12, mounted on the dials, and a downward pull is exerted on the tab 21, all of the dials will be simultaneously actuated or rotated until the aperture, in which the cord being pulled is secured, will be in alignment with the apertures 22 in the baseboard 23 and the axes of the dials 9. A flexible compensating member 25 is interposed in each cord 18 and functions to compensate for any variations in the length of the cords when the tab 21 is pulled downwardly to rotate the dials. Thus, when it is desired to rotate the dials to tune in a station, the selected tab 21 will be drawn downwardly until all of the dials come to a stop, each in a position determined by the predetermined location of the cords 18 on the annular rings 12.

To apply this device to a radio set, the various broadcasting stations are first tuned in by manually operating the dials 9. As soon as a station has been tuned in, the upper ends of the cords 18 will be secured in the apertures of the annular rings 12 located directly opposite the reading on the dials, determined by the stationary marks 26 provided on the panel 8 above each dial. As soon as the cords have thus been secured to the rings 12, the call letters of the station may be marked upon the tab 21 so that the operator will know what tab to pull when it is desired to bring in a certain station. After a number of stations have thus been tuned in and the cords 18 secured to their respective apertures in the annular rings 12, the operator may readily and quickly tune from one station to another by pulling upon the selected tab depending beneath the receiving set. This is of particular advantage in receiving sets employing three or more tuning dials, as by its use the dials may quickly be adjusted to a predetermined position without loss of time.

In Figures 5 and 6, there is shown a slightly modified construction wherein a guide block 27 is mounted upon the baseboard 23 beneath each dial. This guide block is provided with a series of apertures 28 through which the cords 18 are passed, as shown in the above mentioned figures. These blocks 27 function to guide the cords in a manner similar to the function of the apertures 22 shown in Figures 1, 2 and 3.

The novel device shown on the drawing is designed as an attachment to an ordinary tuning dial and is demountably secured thereto by means of the set screws 16. If desired, the device may readily be removed from the dials and the set tuned in the usual manner. It is also to be understood that in place of the spider-like member or attachment, here shown demountably secured to the dial, a special dial may be provided having a marginal edge portion wherein the apertures 17 may be provided as now shown in the annular ring 12. Other means may also be provided for securing the ends of the cords 18 to the annular rings 12 without departing from the invention.

It will be understood that the spider-like rings need not be mounted directly upon the tuning dials, but may be suitably connected thereto as in the rear of these dials.

In the accompanying drawing, this novel tuning device is shown as applied to a receiving set employing three tuning dials, but it is to be understood that the device may be used on any type of receiving set, whether employing one or a plurality of tuning dials, by simply varying the number of cords 18 to the number of dials employed. Also, if desired, extension cords (not shown) may be secured to the tab cords 19, thereby providing means whereby the operator may readily and conveniently tune the receiving set from a point remote from the receiver.

I claim as my invention:

1. The combination, with a radio set having a plurality of tuning dials, of means for simultaneously moving said dials to set them to indicate a certain combination of characters or figures thereon, said means comprising flexible connections having tabs indicating different stations adapted to be pulled by the operator, and means for transmitting such pull to rotate and set said dials.

2. The combination, with a radio set having a plurality of tuning dials, of spiders secured to said dials, each having a group of perforations therein, flexible means adapted to enter said perforations, said flexible means when pulled rotating all of the dials simultaneously to set them to indicate certain figures or characters.

3. The combination, with a radio set having a plurality of tuning dials, of spider-like rings mounted on said dials and having groups of perforations therein, each perforation corresponding to a certain figure or character on the dial and setting the dial for such figure or character when the perforation is moved to a point below and in line with the vertical axis of the dial, and means engaging said perforations for shifting all of the dials simultaneously to set them to indicate a certain group of figures or characters.

4. The combination, with a radio set having a plurality of tuning dials, of a series of cords and guides therefor arranged adjacent to said dials and having tabs corresponding to the combination of figures or characters for which the dials must be set to tune in a certain station, and means connecting said cords with said dials for rotating all the dials simultaneously to set them for the combination of figures or characters represented by the cord that is operated.

5. The combination, with a radio receiving set having a tuning dial, of a flexible actuating member having one end demountably and selectively secured to the tuning dial, said actuating member passing through a stationary guide and having an indicating tab secured to the opposite end thereof, whereby it may be pulled to actuate the tuning dial.

6. The combination, with a radio set having a plurality of dials, of tabs representing the logs of different stations, flexible elements connecting the tabs to said dials and adapted to be operated separately to set the dials simultaneously for the log of each station.

7. The combination, with a radio set having a plurality of dials, of flexible devices adapted to represent the logs of different stations and connected for individual movement to said dials for moving them simultaneously to log the desired station.

8. The combination, with a radio set having a plurality of tuning dials, of spiders connected thereto and having a group of perforations therein, flexible means connected with said perforations, said flexible means when pulled rotating all of the dials simultaneously to set them to indicate certain figures or combinations.

9. The combination, with a radio set having a plurality of tuning dials, of spider-like rings connected thereto and having groups of perforations, each perforation corresponding to a certain figure or character on the dial, and adapted for setting the dial in correspondence to such figure or character when the perforation is moved to a point below and in line with the vertical axis of the dial, and means engaging said perforations for shifting all of the dials simultaneously to set them in correspondence to a certain group of figures or characters.

10. The combination, with a radio set having a plurality of tuning dials, of members axially concentric with said dials and having groups of perforations therein, each perforation corresponding to a certain figure or character on the dial and setting the dial in correspondence to said figure or character when the perforation is moved to a point below and in line with the vertical axis of the dial, and means engaging said perforations for shifting all the dials simultaneously to set them to indicate a certain group of figures or characters.

11. A device of the class described, comprising a plurality of rotatable dials, a guide adjacent each dial, flexible dial operating means for each dial connected for rotating the dial in predetermined degree, said flexible means passing through respective guides, and thereafter connected for movement in unison.

12. A plurality of rotatable graduated dials, a series of flexible dial operating means for each dial, each adapted for rotating the dial, in a different degree, corresponding to the graduations of the dial, a common guide for the dial operating means of each dial, one member of each series of means of each dial connected together, after passing through the guides, for movement in unison.

13. The combination, with an adjustable controlling element of a radio receiving system, of means acting upon operation to effect the movement of said element in a direction automatically determined by the position of said element.

14. The combination, with an adjustable controlling element of a radio receiving system, of means acting upon operation to effect the movement of said element in a direction automatically determined by the position of said element directly to a predetermined position.

15. The combination, with an adjustable controlling element of a radio receiving system, of means acting upon operation to effect the movement of said element in a direction automatically determined by the position of said element and stop it in a predetermined position.

16. The combination, with an adjustable controlling element of a radio receiving system, of means acting upon operation to effect the movement of said element in an automatically determined direction of its adjustment to a predetermined position, the direction in which the movement of said element will be effected by the operation of said means being automatically determined by the position of said element with respect to said predetermined position at the time of operation of said means.

17. The combination, with an adjustable controlling element of a radio receiving system, of means acting upon operation to effect the movement of said element in an automatically determined direction of its adjustment and stop it in a predetermined position, the direction and extent of such movement being automatically determined by the position occupied by said element with respect to said predetermined position at the time of operation of said means.

18. The combination, with an adjustable controlling element of a radio receiving system, of means acting upon operation to effect the movement of said element directly to a predetermined position, the direction in which the movement of said element will be effected by the operation of said means being automatically determined by the position of said element with respect to said predetermined position at the time of operation of said means.

19. The combination, with an adjustable controlling element of a radio receiving system, of means acting upon operation to effect the movement of said element directly to and stop it in a predetermined position, the direction and extent of such movement being automatically determined by the position occupied by said element with respect to said predetermined position at the time of operation of said means.

20. The combination, with an adjustable controlling element of a radio receiving system, of means acting upon operation to effect the movement of said element in a direction automatically determined by the position of said element to a desired position, said means comprising a member adjustable with respect to said element whereby said desired position may be adjustably predetermined.

21. The combination, with an adjustable controlling element of a radio receiving system, of means connected with said element acting upon operation to move said element in a direction automatically determined by the position of said element to a desired position, the connection of said means with said element being adjustable whereby said desired position may be adjustably predetermined.

22. The combination, with an adjustable controlling element of a radio receiving system, of means acting upon operation in one direction of its movement to effect the movement of said element in either direction of its adjustment.

23. The combination, with an adjustable controlling element of a radio receiving system, of means acting upon operation in one direction of its movement to effect the movement of said element in either direction of its adjustment directly to a predetermined position.

24. The combination, with an adjustable controlling element of a radio receiving system, of means acting upon operation in one direction of its movement to effect the movement of said element in either direction of its adjustment and stop it in a predetermined position.

25. The combination, with a rotatable controlling element of a radio receiving system, of means acting upon operation in one direction to effect the rotation of said element in either direction.

26. The combination, with a rotatable controlling element of a radio receiving system, of means acting upon operation to effect the rotation of said element in the proper direction to bring it directly to a predetermined position, the direction of its rotation being automatically determined by the position of said element at the time of operation of said means.

27. The combination, with an adjustable controlling element of a radio receiving system, and an adjusting manual for said element, of additional means for adjusting said element comprising a member adjustable with respect to said manual and acting upon operation to move said element in either direction of its adjustment to a predetermined position, the direction in which said element will be moved by the operation of said means being automatically determined by the position of said manual at the time of operation of said means.

28. The combination, with an adjustable tuning element of a radio receiving system, of a plurality of selectively operable means each acting upon operation to effect the movement of said element to a predetermined position.

29. The combination, with an adjustable tuning element of a radio receiving system, of a plurality of selectively operable means acting upon selective operation thereof to effect the movement of said element to respectively different positions.

30. The combination, with an adjustable controlling element of a radio receiving system, of a plurality of selectively operable means each acting upon operation to effect the movement of said element to a desired position, each of said means comprising a member adjustable with respect to said element whereby each desired position may be adjustably predetermined.

31. The combination, with an adjustable controlling element of a radio receiving system, of a plurality of individually operable means acting upon selective operation thereof to effect the movement of said element to respectively different desired positions, each of said means comprising a member adjustable with respect to said element whereby said different desired positions may be individually and adjustably predetermined.

32. The combination, with an adjustable controlling element of a radio receiving system, of a plurality of selectively operable means each acting upon operation to effect the movement of said element and stop it in a desired position, each of said means comprising a member adjustable with respect to said element whereby the respective desired position may be adjustably predetermined.

33. The combination, with an adjustable controlling element of a radio receiving system, of a plurality of individually operable means acting upon selective operation thereof to effect the movement of said element and stop it in respectively different desired positions, the action of each of said means comprising a member adjustable with respect to said element whereby said respectively different desired positions may be individually and adjustably predetermined.

34. The combination, with an adjustable controlling element of a radio receiving system, of a plurality of selectively operable manuals, movable means common to all of said manuals and acting upon operation of each thereof to effect the movement of said element, and a plurality of individually adjustable means each serving to adjustably fix the relationship between said movable means and one of said manuals, whereby the individual adjustment of said adjustable means will determine the extent to which the operation of each of said manuals will effect the movement of said element.

35. The combination, with an adjustable controlling element of a radio receiving system, of a plurality of selectively operable manuals, movable means common to all of said manuals and acting upon operation of each thereof to effect the movement of said element, and a plurality of individually adjustable means co-operating with said movable means and separately acted upon by each of said manuals, whereby the individual adjustment of said adjustable means will determine the extent to which the operation of each of said manuals will effect the movement of said element.

36. The combination, with an adjustable controlling element of a radio receiving system and a rotatable shaft operatively connected therewith, of means fixed upon said shaft providing a plurality of radially arranged engagements, and operating means applicable to any selected one of said plurality of engagements, whereby through the selective application and the operation of said operating means said shaft may be turned to effect the adjustment of said element to a selected predetermined position.

37. The combination, with an adjustable controlling element of a radio receiving system and a rotatable shaft operatively connected therewith, of means fixed upon said shaft providing a plurality of radially arranged engagements, and a plurality of selectively operable operating means each applicable to any selected one of said plurality of engagements, whereby through the selective application and selective operation of said operating means said shaft may be turned to different degrees to effect the adjustment of said element to different predetermined positions.

38. The combination, with an adjustable controlling element of a radio receiving system and a rotatable shaft operatively connected therewith, of means fixed upon said shaft providing a plurality of radially arranged engagements, engageable at different distances from said shaft and upon different radii thereof, and operating means applicable to any selected one of said plurality of engagements, whereby through the selective application and the operation of said operating means said shaft may be turned to effect the adjustment of said element to a selected predetermined position.

39. The combination, with a plurality of adjustable controlling elements of a radio receiving system, of means acting upon operation to effect the movement of said elements collectvely to predetermined positions, the direction in which the movement of said elements will be thus effected being automatically determined by the position of said elements.

40. The combination, with a plurality of adjustable controlling elements of a radio receiving system, of means acting upon operation to effect the movement of said elements collectively to predetermined positions, the extent to which the movement of said elements will be thus effected being automatically determined by the position of said elements.

41. The combination, with a plurality of adjustable controlling elements of a radio receiving system, of means acting upon operation to effect the movement of said elements collectively, each to a predetermined position, the direction in which the movement of each of said elements will be thus effected being individually determined by the position of each respective element.

42. The combination, with a plurality of adjustable controlling elements of a radio receiving system, of means acting upon operation to effect the movement of said elements collectively, each to a predetermined position, the extent to which the movement of each of said elements will be thus effected being individually determined by the position of each respective element.

43. The combination, with a plurality of adjustable controlling elements of a radio receiving system, of means acting upon operation to effect the movement of said elements collectively to individually predetermined desired positions, said means comprising a member adjustable with respect to each of said elements, whereby the desired position to which the movement of each of said elements will be effected by the operation of said means may be adjustably predetermined.

44. The combination, with a plurality of adjustable controlling elements of a radio receiving system, of means acting upon operation to effect the movement of said elements collectively and stop them each in an individually predetermined desired position, said means comprising a member adjustable with respect to each of said elements, whereby said desired position of each of said elements may be adjustably predetermined.

45. The combination, with a plurality of adjustable controlling elements of a radio receiving system, of a plurality of selectively operable means each acting upon operation to effect the movement of said elements collectively, each to an individually predetermined desired position, each of said means comprising a member adjustable with respect to each of said elements, whereby the position to which the movement of each of said elements will be effected by the operation of each of said means may be adjustably predetermined.

46. The combination, with an adjustable controlling element of a radio receiving system, of means acting upon operation to effect the movement of said element to and stop it in a predetermined desired position, comprising a reciprocably movable manual and flexible means connecting said manual with said element, whereby operation of said manual in one direction of its movement will act through said flexible means to draw said element to and stop it in said desired position.

47. The combination, with an adjustable controlling element of a radio receiving system, of means acting upon operation to effect the movement of said element to a desired position, comprising a reciprocably movable manual and flexible means adjustably connecting said manual with said element, whereby operation of said manual in one direction of its movement will act through said flexible means to draw said element to said desired position, and whereby the desired position to which said element will be drawn by such operation of said manual may be adjustably predetermined by the adjustment of said flexible means.

48. The combination, with an adjustable controlling element of a radio receiving system, of a plurality of individually operable means acting upon selective operation thereof to effect the movement of said element to respectively different predetermined positions, comprising a plurality of individually operable manuals and flexible means connecting each of said manuals with said element.

49. The combination, with an adjustable controlling element of a radio receiving system, of a plurality of selectively operable means each acting upon operation to effect the movement of said element to a desired position, comprising a plurality of individually operable manuals and flexible means connecting each of said manuals with said element, the connection of said flexible means being adjustable, whereby the desired position to which said element will be moved by the operation of each of said manuals may be adjustably predetermined with respect to each said manual.

50. The combination, with a positionably adjustable element of a radio receiving system, of a plurality of individually operable means, each representing a predetermined position of said element and each acting upon operation thereof to effect the movement of said element from any position of its adjustment to the particular predetermined position represented thereby.

51. The combination, with a positionably adjustable element of a radio receiving system, of a plurality of selectable operable means representing respectively different predetermined positions of said element and acting upon individual operation thereof to effect the selective movement of said element from any position of its adjustment to one of said respectively different predetermined positions.

52. The method of tuning a radio receiving system to any desired one of a number of predetermined frequencies, which system is provided with an adjustable tuning element and a plurality of individually operable manuals each representing one of said predetermined frequencies, which method comprises the selective operation of that one of said plurality of manuals which represents the desired one of said number of predetermined frequencies to effect by such operation the movement of said tuning element from any position of its adjustment to a predetermined position of adjustment.

53. The method of tuning a radio receiving system to any desired one of a number of predetermined frequencies, which system is provided with a reversely adjustable tuning element and a plurality of individually operable manuals each representing one of said predetermined frequencies, which method comprises the selective operation of that one of said plurality of manuals which represents the desired one of said number of predetermined frequencies to effect by such operation the movement of said tuning element in either direction of its adjustment directly to a predetermined position of adjustment.

54. The method of operating an adjustable controlling element of radio receiving apparatus to a desired one of a number of predetermined positions of its adjustment, which apparatus is provided with a plurality of individually operable controls each operable to selectively determine the position of said element, which method comprises the operation of a selected one of said plurality of controls to effect by such operation the selective movement of said element from any position of its adjustment to the desired predetermined position thereof.

55. The method of operating a reversely adjustable controlling element of radio receiving apparatus to a desired one of a number of predetermined positions of its adjustment, which apparatus is provided with a plurality of individually operable controls each operable to selectively determine the position of said element, which method comprises the operation of a selected one of said plurality of controls to effect by such operation the selective movement of said element in either direction of its adjustment directly to a predetermined position of adjustment.

In witness whereof, I have hereunto subscribed my name.

WILFRID PAUL HEATH.

DISCLAIMER

Re. 17,531.—*Wilfrid Paul Heath*, Seattle, Wash. METHOD AND MEANS FOR TUNING RADIO RECEIVERS. Patent dated December 17, 1929. Disclaimer filed August 15, 1941, by the assignee, *Zenith Radio Corporation.*

Hereby enters this disclaimer to claims 28 and 29 in said specification.

[*Official Gazette September 9, 1941.*]

55